United States Patent [19]
Newman et al.

[11] Patent Number: 5,280,013
[45] Date of Patent: Jan. 18, 1994

[54] METHOD OF PREPARING HIGH TEMPERATURE SUPERCONDUCTOR FILMS ON OPPOSITE SIDES OF A SUBSTRATE

[75] Inventors: Nathan Newman, Montara; Aharon Kapitulnik, Palo Alto; Brady F. Cole, Sunnyvale; Randy W. Simon, Belmont, all of Calif.

[73] Assignee: Conductus, Inc., Sunnyvale, Calif.

[21] Appl. No.: 968,280

[22] Filed: Oct. 29, 1992

Related U.S. Application Data

[63] Continuation of Ser. No. 726,032, Jul. 5, 1991, abandoned.

[51] Int. Cl.$^5$ .......................................... H01L 39/24
[52] U.S. Cl. ............................ 505/1; 505/701; 505/702; 505/731; 505/732; 505/728; 505/866; 427/62; 427/404; 427/419.3; 228/116; 228/121
[58] Field of Search ............... 505/731, 732, 701, 702, 505/728, 866; 427/62, 63, 419.3, 404; 228/116, 121; 156/643; 333/238

[56] References Cited

U.S. PATENT DOCUMENTS

| 4,672,354 | 6/1987 | Kurtz et al. |
|---|---|---|
| 4,916,116 | 4/1990 | Yamazaki . |
| 4,966,885 | 10/1990 | Hebard . |
| 5,075,655 | 12/1991 | Pond et al. ........................ 333/238 |
| 5,774,196 | 9/1988 | Blanchard . |

FOREIGN PATENT DOCUMENTS

| 0345441 | 12/1989 | European Pat. Off. ...... H01L 39/24 |
|---|---|---|
| 0435765 | 7/1991 | European Pat. Off. ...... H01L 39/14 |
| 0483784 | 5/1992 | European Pat. Off. ...... H01L 39/14 |
| 0508893 | 10/1992 | European Pat. Off. ...... H01L 39/22 |
| 4137238 | 6/1992 | Fed. Rep. of Germany ......... C23C 14/22 |

OTHER PUBLICATIONS

Warner et al., "Laser Ablated High Tc Superconducting Thin $YBa_2Cu_3O_7$ Films on Substrates Suitable for Microwave Applications", Advances in Materials Science and Applications of High Temperature Superconductors, edited by Flom (Apr. 1990) p. 26.

Wu et al., "Growth of High Tc Superconducting Thin Films for Microwave Applications", Proc. SPIE 1477 (Supercond. Appl. Infrared Microwave Devices 2) (1991) pp. 8-14.

Anderson et al., "Substrates for Superconductive Analog Signal Processing Devices", IEEE Transactions on Magnetics, vol. Mag-19, No. 3 (May 1983) pp. 485-489.

Tanaka, et al., "High Frequency Transmission through Bi-Sr-Ca-Cu-O Double-Sided Microstripline on an MgO Substrate", Japanese Journal of Applied Physics, vol. 30, No. 4B, 15 Apr., 1991, Tokyo, JP, pp. L700-L702.

*Primary Examiner*—Roy King
*Attorney, Agent, or Firm*—Fliesler, Dubb, Meyer & Lovejoy

[57] ABSTRACT

A superconducting electronic circuit device, useful when impedance matching is desired, especially suited to microwave frequencies, consisting of a thin dielectric layer with superconducting layers on both sides. A superconductor such as Yttrium Barium Copper Oxide (YBCO) is formed on a first substrate such as lanthanum aluminate. A protective layer like gold is deposited on the YBCO and a second carrier substrate is bonded to the protected YBCO. The first substrate is then thinned into a thin dielectric film and a second layer of superconductor is epitaxially grown thereon to create the desired circuits.

31 Claims, 2 Drawing Sheets

METHOD OF PREPARING HIGH TEMPERATURE SUPERCONDUCTOR FILMS ON OPPOSITE SIDES OF A SUBSTRATE

This application is a continuation of U.S. patent application Ser. No. 07/726,032, filed Jul. 5, 1991 now abandoned.

DESCRIPTION

1. Technical Field

This invention concerns the production of electronic circuit devices that handle signals over a broad range of frequencies, particularly the higher, more demanding, microwave frequencies. More specifically, devices made from superconducting materials, especially high critical temperature (Tc) superconductors (HTS), are the subject of this process and product invention.

2. Background of the Invention

Electronic devices that operate from low frequencies up through the microwave portion of the spectrum are important for communication, data processing, and other applications. These devices include transmission lines, filters, resonators, delay lines and other structures. The performance of these devices can be enhanced by the use of superconducting materials, which offer lower resistive losses and lower dispersion of signals than normal metal conductors such as copper or gold.

Conventional superconductors, such as elemental niobium, require devices to be operated at temperatures near the boiling point of liquid helium (4 degrees Kelvin), a difficult and costly temperature to maintain. Higher Tc superconductors permit devices to operate at or near the more practical boiling point of liquid nitrogen (77 degrees Kelvin). The newer high Tc superconductors are members of a class of layered perovskite compounds in which electronic transport takes place in planes formed by copper and oxygen atoms. As a result, these materials are referred to as copper oxide superconductors or simply cuprates. Examples include varying stoichiometric compounds of YBaCuO, LaSrCuO, BiSrCaCuO, and TlBaCaCuO. Of particular interest is the compound composed of yttrium, barium, copper, and oxygen (YBCO) in the ratios of 1:2:3:7.

The application of HTS technology to electronic devices, especially in the microwave region of the electromagnetic spectrum, has been complicated by the fabrication requirements for HTS films. In particular, the basic device geometry needed for microwave components is difficult to achieve with the materials and methods currently in practice. Typical microwave circuit elements and general impedance matched transmission lines consist of a ground plane metallization, a dielectric layer overlaying the ground plane, and a thin strip conductor layer, on top of the dielectric layer, that contains the active circuit. Alternating current signal propagation is primarily by electromagnetic waves traveling in the dielectric layer between the ground plane and the thin strip.

The circuit elements need to be impedance matched for efficient and reflection free operation. The impedance of the structure is determined by the thickness of the dielectric layer, its dielectric constant, and the width of the conducting strip. For standard 50 ohm impedances, commonly used dielectric materials dictate dielectric thicknesses comparable to the line widths of the conducting layer. In densely packed circuits, with line widths on the order of a few microns, dielectric thickness must also be on the order of only a few microns.

The difficulty of fabricating high temperature superconducting films on opposite sides of a very thin dielectric layer, perhaps as thin as a few microns, has restricted the development of HTS microwave devices. Common sense suggests two possible approaches to this problem. The first approach would be to deposit superconductor film on opposite sides of a thin dielectric substrate such as lanthanum aluminate or sapphire. The second approach would be to deposit the layers sequentially (superconductor, dielectric, superconductor) on a thick substrate. Unfortunately, neither of these approaches is practical because of the essential requirements for depositing thin HTS films.

The advantageous properties of HTS films are available only in samples grown with a high degree of crystalline order. To maintain this order, high quality HTS films are preferably grown on substrate materials that do not interact chemically with the film and that have crystal structures which permit oriented growth of the superconductor. Substrates that are lattice-matched to the superconductor, such as lanthanum aluminate or strontium titanate, are particularly well suited to this purpose as they provide a nearly ideal template for epitaxial growth of the superconductor thereon.

Some otherwise desirable substrates, such as sapphire and silicon, fail to satisfy one or more of the criteria stated above, lacking chemical stability with HTS films or a close lattice match. Nevertheless, it is still possible to grow high quality HTS films on silicon and sapphire by depositing a thin buffer layer between the substrate and the HTS film.

HTS films are generally formed by vaporizing the constituent components of the HTS material and allowing them to impinge upon a substrate. The components may be vaporized by laser ablation, sputtering, or other techniques. The substrate must be maintained at a temperature suitable for forming the proper crystal structure, typically above 700 degrees C., in an oxygen rich environment. In order to grow HTS films with uniformly excellent properties on substrates of technologically useful sizes (1 to 5 square centimeters), it is necessary to control the temperature of the substrate within a narrow range over the entire area of the substrate. To achieve this temperature control, the substrate is clamped or tightly bonded to a heater. It is also possible to control the temperature by radiation heating.

These heating techniques necessarily subject the thin brittle substrates to mechanical and thermal stresses, leading to an unacceptable amount of breakage even in substrates as thick as 250 microns. Clearly, substrates that are ten or even a hundred times thinner would have no structural integrity without continuous physical support. Thus, it is very difficult to deposit HTS films on opposite sides of such a thin dielectric substrate, in accordance with the first common sense approach mentioned above and the challenge is further exacerbated as the substrate thickness is reduced. And yet, substrates with thicknesses of 250 microns or greater place unacceptable constraints on line widths and component densities in microwave circuits.

The second common sense approach is to sequentially deposit layers of superconductor, dielectric, and superconductor on an appropriate substrate. Whereas the strategy of the first approach is unworkable because free standing substrates under 250 microns are too thin to work with, the strategy of the second approach fails because it is not practical to deposit thick dielectrics. It is very hard to grow dielectric materials with the desired crystalline quality and dielectric properties in thicknesses over a half micron. If the crystalline structure is poor, it will not support the growth of the second layer of superconductor. If the quality of the dielectric or superconductor is poor, the device performance will be degraded.

This invention overcomes the above problems, allowing the construction of useful devices from high Tc superconductors spaced by a suitably thin dielectric substrate.

SUMMARY OF THE INVENTION

Briefly, this invention allows the fabrication of practical and robust HTS devices with dielectric layer thicknesses in the range of 1 to 250 microns. A novel fabrication sequence is described that begins with the deposition of an HTS film on a first substrate thick enough to be conveniently handled. The superconductor is then covered with a special protective layer that controls the migration of oxygen out of and into the superconductor. The protective layer also prevents the reaction of the superconductor with future layers during processing and film growth. Copper-oxide superconductors are very reactive, and any disruption of their stoichiometry or crystal structure quickly degrades their superconductivity.

The protected superconductor layer is then bonded to a second carrier substrate so that the superconductor is mechanically sandwiched between two stabilizing substrates. So stabilized, the original first substrate can now be machined and polished as thin as desired to form a dielectric layer from 1 to 250 microns thick as needed. The second superconductor is then deposited onto the dielectric layer to complete the superconductor-dielectric-superconductor (SDS) structure. This SDS structure is appropriate and useful not only for microwave circuits, but also for components, devices, and circuits operating at any frequency, even in direct current applications where impedance matching is desirable.

Additional details and benefits are described hereinafter with reference to the drawings.

BRIEF DESCRIPTION OF THE DRAWINGS

FIG. 2 shows the deposited first superconductor layer on a first substrate;

FIG. 3 shows the addition of a protective layer on the first superconductor layer;

FIG. 4 shows the FIG. 3 structure bonded to a carrier substrate to mechanically stabilize the structure;

FIG. 5 shows the first substrate reduced in thickness to create a thin dielectric layer; and FIG. 6 shows the addition of the second superconductor to create the SDS structure.

DETAILED DESCRIPTION OF THE INVENTION

Figure 1:
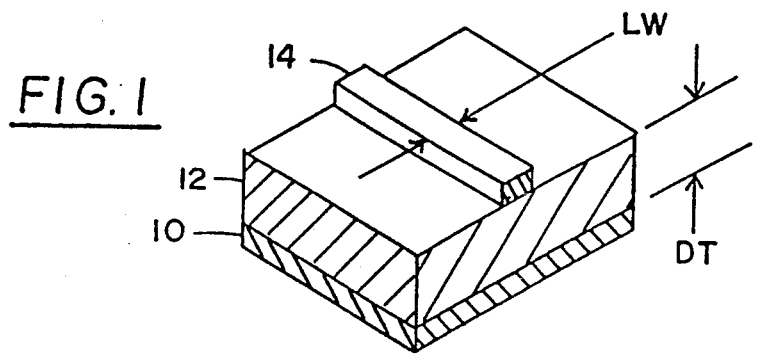
FIG. 1 is a perspective view of a fragmentary portion of the operative layers of the desired SDS structure resulting from the fabrication sequence of the present invention.

FIG. 1 depicts a typical portion of a superconducting microwave circuit using the SDS structure. The essential elements are a ground plane superconductor layer 10, a thin dielectric layer 12, and a strip of superconducting material 14. Signals propagate primarily in the form of electromagnetic waves in the dielectric layer 12 bounded by the ground plane 10 and the strip 14. Strip 14 can be made very long to create devices such as a signal delay line, or formed with capacitively coupled gaps to create filters or resonators, or simply used as a signal carrying transmission line. For the typically used characteristic impedance, the dielectric thickness DT needs to be on the order of the line width LW. To achieve the required circuit packing density compatible with contemporary designs, LW may be as small as one micron, which means that DT may have to be as thin as one micron. FIGS. 2-6 illustrate the stages of a method of creating the unique SDS structure of FIG. 1 using HTS films and compatible dielectrics that allows DT to be in the range of 1 to 250 microns.

Figure 2:
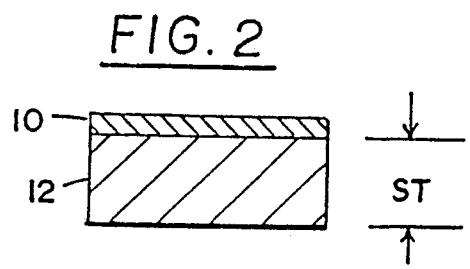
FIGS. 2-6 show the sequential steps used to produce the structure of FIG. 1 as follows.

In FIG. 2, a first layer of superconducting material 10 has been epitaxially grown on a first substrate 12. YBCO is the preferred superconductor, while lanthanum aluminate or magnesium oxide are the preferred substrate materials. The particular method of growing or depositing the superconducting films is not critical to this invention. The preferred deposition processes are laser ablation and off-axis sputtering, but any deposition process may be used, including other forms of physical vapor deposition, chemical vapor deposition, metalorganic chemical vapor deposition, and even liquid phase epitaxy if that technique should evolve to the point of depositing high quality films.

In general, the highest quality YBCO films are made by an in situ deposition process, in other words, a process that does not require a high temperature post-deposition anneal to form the superconducting crystal structure. However, other workers in the art have reported producing high quality YBCO films by a so-called "barium fluoride" technique, in which the film is formed first in an amorphous structure which includes fluorine, then annealed at high temperature in an oxygen environment to drive out the fluorine, drive in the oxygen, and form the desired crystalline structure. The films of this invention may be made by the barium fluoride technique, in which case the appropriate annealing steps must be included.

If first substrate 12 is sapphire or silicon, the structure may also include a thin dielectric buffer layer deposited between layers 10 and 12. YBCO chemically reacts with sapphire and silicon, thereby degrading its superconducting properties. This degradation can be avoided by depositing one or more intervening buffer layers which do not react with either YBCO or the substrate material. Suitable buffer layer materials include strontium titanate, calcium titanate, magnesium oxide, and yttria-stabilized zirconia. Intervening buffer layers can also improve the epitaxy of the YBCO. An embodiment incorporating an intervening thin buffer layer 11 will be discussed later with respect to FIG. 7.

Still with reference to FIG. 2, substrate 12 has a thickness ST of perhaps 20 mils (500 microns) at this stage, which makes it reasonably stable and workable. This thickness is essential because substrate 12 must be structurally stable and allow sufficient lateral heat conduction to thermally equalize its upper growth surface at a uniform constant temperature of approximately 750 degrees Celsius during the growth of superconducting layer 10. In the preferred embodiment, substrate 12 is held to the heater with a silver paste, clamped to a metallic foil, brazed with a silver alloy, or radiatively heated to ensure completely uniform temperatures over the growth surface.

Figure 3:
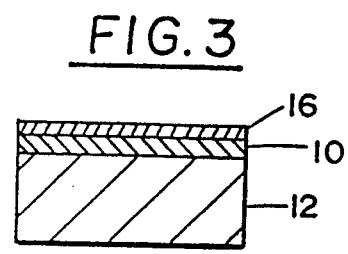

FIG. 3 shows the next stage of the process, in which a protective layer (or layers) 16 has been deposited over the superconductor layer 10. Protective layer 16 is necessary because some of the HTS crystalline phases, particularly with the YBCO compound, are unstable at the temperatures and pressures used in the deposition process. The materials tend to lose oxygen, which degrades their superconducting properties. For example, if low oxygen pressures are encountered at high temperatures, the orthorhombic YBCO phase will lose oxygen and may transform to an insulating phase with tetragonal symmetry or even decompose into species such as $Y_2BCuO_5$, $BaCuO_2$, and/or $Cu_2O$. In addition, YBCO is highly reactive with many substances and may degrade during subsequent processing steps without protection. Protective layer 16 controls oxygen diffusion and prevents chemical interaction or diffusion between superconductor layer 10 and subsequent bonding layers. Layer 16 may comprise silver, gold, or an oxide such as $SiO_2$ or $Al_2O_3$. Gold is preferred, since it is the most non-reactive element available and best controls chemical diffusion and oxygen loss. Alternatively, layer 16 may include a source of oxygen in the form of another YBCO layer or a layer of a different oxide material such as silver oxide, which decomposes at elevated temperatures to release oxygen.

In microwave technology developed for low Tc superconducting materials such as niobium, oxygen-reactive species such as chromium and indium alloys can be used in direct contact with, or in close proximity to, the superconducting films. Using these same methods with high Tc superconductors would cause loss of oxygen from the HTS film during the fabrication process and therefore degrade the superconducting properties. But materials such as silver, gold, and silicon dioxide cause minimal degradation and actually form protective barriers on the HTS films. Surface resistance of YBCO has been found to be not significantly affected by these materials.

Figure 4:
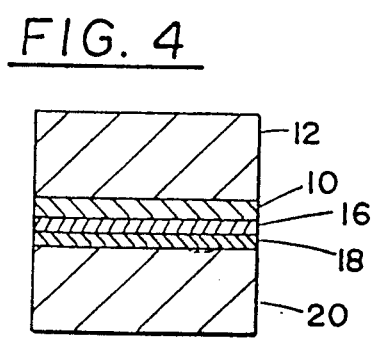

In FIG. 4, the structure shown in FIG. 3 has been inverted and bonded to a carrier substrate 20 with suitable bonding layers 18. Bonding layers 18 may comprise elemental metals or metal alloys that are diffusion bonded or heat melted in place. These layers 18 may consist of thin metal foils or thin metal films deposited directly on layers 16 or 20 by chemical or physical deposition methods. Alternatively, organic adhesives may be used. If protective layer 16 is made from silver or gold, it could possibly also serve as the bonding layer 18. Carrier substrate 20 stabilizes the structure. Carrier substrate 20 is preferably made of the same material as the first substrate 12, or at least a substance having similar thermomechanical characteristics so as to eliminate mechanical stress during extreme temperature changes. Superconducting layer 10 is now sandwiched between the first substrate 12 and carrier substrate 20 which makes it possible to polish first substrate 12 to reduce its thickness to the desired value without danger of contaminating or physically damaging superconductor layer 10. In addition, substrate 12 is physically supported by carrier substrate 20 against physical fracture.

Figure 5:
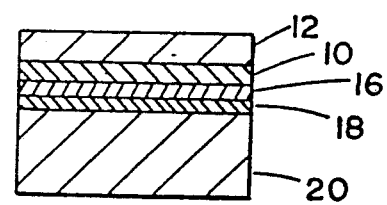

In FIG. 5, the first substrate 12 has been polished to form a thin dielectric layer 12. The layer 12 may be machined or chemically etched to a thickness in the range of 1 to 250 microns, as desired, to form a dielectric layer for electronic circuits.

Figure 6:
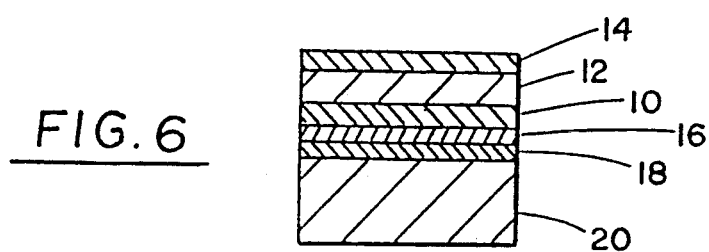

Finally, in FIG. 6, a second superconductor layer 14 is deposited on dielectric layer 12. The second superconducting layer 14 may then be patterned by standard techniques to form the desired device, component, or circuit as discussed with respect to FIG. 1. Heating is once again accomplished by brazing and/or clamping carrier substrate 20 to a heater or radiatively heating to facilitate high quality epitaxial growth of the second superconductor layer 14. Since the composite SDS structure is thicker than a single substrate, it may be necessary to supply more energy to the substrate heater in order to provide the optimal temperature at the growing surface.

Additional circuits may be added to the bottom of carrier substrate 20 in FIG. 6, if desired, by depositing and patterning another layer of superconducting material thereon.

Figure 7:
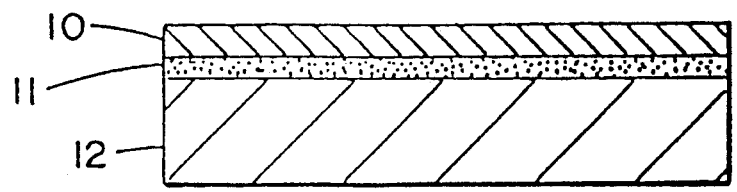
FIG. 7 shows another embodiment of the invention similar to FIG. 2 except with a buffer layer interposed between the first substrate and the first superconductor layer.
Figure 8:
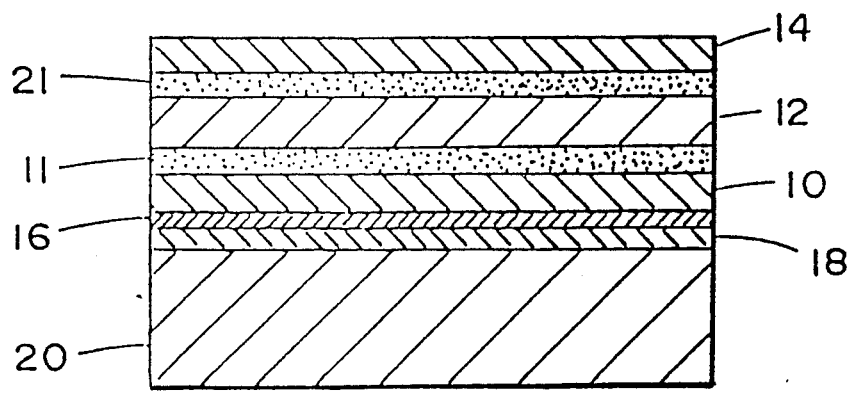
FIG. 8 shows the SDS structure of FIG. 6 with buffer layers interposed between the dielectric layer and both superconducting layers.

As mentioned earlier, it may be desirable to include a thin dielectric buffer layer 11 deposited between layers 10 and 12, as shown in FIG. 7, to avoid having the superconducting layer chemically react with the substrate, thereby degrading its superconducting properties. This degradation can be avoided by depositing one or more intervening buffer layers 11 which do not chemically react with either the superconductor or the substrate material. Suitable buffer layer materials include strontium titanate, calcium titanate, magnesium oxide, and yttria-stabilized zirconia. Intervening buffer layers can also improve in-plane epitaxy of the superconductor. The structure of claim 7 is inverted and bonded to a carrier substrate 20 with bonding layers 18, in a manner similar to that of FIG. 4. The substrate layer 12 is thinned into a suitable dielectric layer and a second intervening buffer layer 21 is deposited on layer 12 followed by a second superconductor layer 14 to form the SDS structure shown in FIG. 8. FIG. 8 is essentially the same structure as FIG. 6, except including buffer layers 11 and 21.

The efficacy of this technique has been established by fabricating a microwave parallel-plate resonator using YBCO as the superconductor and gold for both the bonding layer 18 and the protective layer 16. Bonding was performed at a temperature of 800 degrees C. at an elevated uniaxial pressure. The resonator had a Q of approximately 6040 at a frequency of 6.41 GHz. In addition, we have successfully used gold and silver diffusion bonds to make double sided YBCO structures.

This invention is also appropriate for bismuthate superconductors such as $Ba_{1-x}K_xBiO_3$ or $Ba_{1-x}Rb_x$-$BiO_3$. Bismuthates have lower transition temperatures but offer the advantages of a cubic structure and the opportunity to make hysteretic Josephson junctions, which might make it possible to integrate digital signal processing circuits based on familiar varieties of superconducting logic. Although the bismuthates are not susceptible to oxygen loss, they present similar problems with respect to forming two superconductor layers on opposite sides of a very thin dielectric.

This invention is appropriate for all known oxide superconductors and all known substrates on which HTS films are deposited including lanthanum aluminate, neodymium gallate, calcium neodymium aluminate, sapphire, silicon, lanthanum strontium gallate, and yttrium oxide. The substrate materials determine, to a degree, the quality of the superconducting films and the need for buffer layers but are otherwise not essential to the novelty of this invention.

The process described in this disclosure allows the creation of a never before obtainable structure that permits HTS microwave devices and circuits, as well as other impedance matched devices and circuits, to be fabricated with interlayer dielectrics over a wide range of thicknesses. In particular, the disclosed new process can be used to make denser circuits and higher frequency components than the prior art allows. Slight variations in the enumerated steps are, of course, possible. But the invention should be limited only in accordance with the appended claims and their equivalents.

We claim:

1. A method of making superconducting electronic structures with superconducting layers on opposite sides of a thin dielectric layer comprising the steps of:
    forming a first layer of superconducting material on a first mechanically stable substrate;
    forming a protective layer on said first layer of superconducting material;
    attaching a second mechanically stable carrier substrate to said protective layer;
    thinning said first substrate to form a thin dielectric layer; and
    forming a second layer of superconducting material on the side of said dielectric layer opposite from said protective layer.

2. The method of claim 1, wherein said first and second layers of superconducting materials are high $T_c$ superconducting materials.

3. The method of claim 1 in which said second layer of superconducting material is patterned to form an electronic circuit structure.

4. The method of claim 1 in which said layers of superconducting material are formed by physical vapor deposition.

5. The method of claim 1 in which said layers of superconducting material are formed by chemical vapor deposition.

6. The method of claim 1 in which said superconducting materials are bismuthates.

7. The method of claim 1 in which said superconducting materials are cuprates.

8. The method of claim 6 in which said superconducting materials comprise a superconducting phase of yttrium barium copper oxide.

9. The method of claim 8 in which said first substrate is selected from the group consisting of lanthanum aluminate, magnesium oxide, and neodymium gallate.

10. The method of claim 9 in which said protective layer comprises a source of oxygen.

11. The method of claim 10 in which said source is an yttrium barium copper oxide compound.

12. The method of claim 10 in which said source is silver oxide.

13. The method of claim 1 in which said protective layer is selected from the group consisting of gold, silver, and an alloy of gold and silver.

14. The method of claim 1 in which said protective layer is an oxide.

15. The method of claim 1 in which said protective layer is $SiO_2$.

16. The method of claim 1 in which said protective layer is $Al_2O_3$.

17. The method of claim 1, wherein said step of attaching comprises the steps of:
    forming a bonding layer on the side of said protective layer opposite from said first layer of superconducting material; and
    attaching said second mechanically stable carrier substrate to the side of said bonding layer opposite from said protective layer.

18. The method of claim 17 in which said bonding layer comprises an adhesive.

19. The method of claim 17 in which said bonding layer is selected from the group consisting of gold, silver, and an alloy of gold and silver.

20. The method of claim 8 in which said first substrate comprises sapphire or silicon.

21. The method of claim 20 including the additional steps of depositing buffer materials between the superconducting layers and the first substrate.

22. The method of claim 21 in which said buffer materials are selected from the group consisting of strontium titanate, calcium titanate, magnesium oxide, and yttria-stabilized zirconia.

23. The method of claim 22, wherein said step of attaching comprises the steps of:
    forming a bonding layer on the side of said protective layer opposite from said first layer of superconducting material; and
    attaching said second mechanically stable carrier substrate to the side of said bonding layer opposite from said protective layer.

24. The method of claim 17 in which said bonding layer is a noble metal.

25. The method of claim 1 in which said protective layer is a noble metal.

26. A method of making superconducting microwave devices comprising the steps of:
    forming a first layer of superconducting material on a first substrate;
    forming a protective layer on said first layer of superconducting material;
    attaching a second substrate to said protective layer;
    thinning said first substrate to a thickness in the range of about 1 to 250 microns to form a dielectric layer suitable for the microwave region of the spectrum; and
    forming a second layer of superconducting material on said dielectric layer to form signal conveying circuits.

27. The method of claim 26, wherein said first and second layers of superconducting materials are high $T_c$ superconducting materials.

28. A method of thinning a substrate for superconducting electronic structures comprising the steps of:
    forming a layer of superconducting material on a mechanically stable first substrate;
    forming a protective layer on said layer of superconducting material;
    attaching a mechanically stable carrier substrate to said protective layer; and
    thinning said first substrate while said first substrate is supported by said carrier substrate.

29. The method of claim 28, wherein said layer of superconducting material is a high $T_c$ superconducting material.

30. A method of making electronic structures with high $T_c$ superconducting layers on opposite sides of a thin dielectric layer, comprising the steps of:
- forming a first layer of high $T_c$ superconducting material on a first mechanically stable substrate;
- attaching a second mechanically stable substrate to said first layer of high $T_c$ superconducting material;
- thinning one of said first and second substrates to form a thin dielectric layer; and
- forming a second layer of high $T_c$ superconducting material on the side of said dielectric layer opposite from said first layer of high $T_c$ superconducting material.

31. The method of claim 30, wherein said one of said first and second substrates is said first substrate, and wherein said step of attaching comprises the steps of:
- forming a protective layer on said first layer of high $T_c$ superconducting material; and
- attaching said second mechanically stable carrier substrate to said protective layer.

* * * * *